US011521906B2

(12) United States Patent
Nomura et al.

(10) Patent No.: US 11,521,906 B2
(45) Date of Patent: Dec. 6, 2022

(54) CIRCUIT MODULE

(71) Applicant: Murata Manufacturing Co., Ltd., Kyoto (JP)

(72) Inventors: Tadashi Nomura, Kyoto (JP); Tetsuya Oda, Kyoto (JP); Hideki Shinkai, Kyoto (JP); Toru Koidesawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 330 days.

(21) Appl. No.: 16/864,444

(22) Filed: May 1, 2020

(65) Prior Publication Data
US 2020/0258797 A1 Aug. 13, 2020

Related U.S. Application Data

(63) Continuation of application No. PCT/JP2018/040532, filed on Oct. 31, 2018.

(30) Foreign Application Priority Data

Nov. 2, 2017 (JP) .............................. JP2017-213150

(51) Int. Cl.
*H01L 23/28* (2006.01)
*H01L 23/538* (2006.01)
(Continued)

(52) U.S. Cl.
CPC .......... *H01L 23/28* (2013.01); *H01L 23/5383* (2013.01); *H05K 3/28* (2013.01); *H05K 3/36* (2013.01); *H05K 2201/10621* (2013.01)

(58) Field of Classification Search
CPC .......... H05K 1/02; H05K 1/0216; H05K 1/14; H05K 1/141–144; H05K 3/28;
(Continued)

(56) References Cited

U.S. PATENT DOCUMENTS

2005/0051358 A1   3/2005   Kawamoto et al.
2008/0210462 A1*  9/2008   Kawagishi .............. H01L 24/97
                                                  29/841
(Continued)

FOREIGN PATENT DOCUMENTS

CN    1692685 A        11/2005
JP    2004-103998 A    4/2004
WO    2017-026430 A1   2/2017

OTHER PUBLICATIONS

International Search Report issued in Patent Application No. PCT/JP2018/040532 dated Jan. 15, 2019.
(Continued)

*Primary Examiner* — Tuan T Dinh
(74) *Attorney, Agent, or Firm* — Pearne & Gordon LLP

(57) ABSTRACT

A circuit module (100) includes: a substrate (10) including a plurality of inner conductors (2); a first electronic component arranged on one main surface (S1) of the substrate (10); a first resin layer (40) provided on the one main surface (S1) and configured to seal the first electronic component; a plurality of outer electrodes (B1) provided on another main surface (S2) of the substrate (10) and including a ground electrode; a conductor film (50) provided at least on an outer surface of the first resin layer (40) and a side surface (S3) of the substrate (10) and connected to the ground electrode with at least one of the plurality of inner conductors (2) interposed therebetween; and a resin film (60).

4 Claims, 13 Drawing Sheets

(51) Int. Cl.
*H05K 3/28* (2006.01)
*H05K 3/36* (2006.01)

(58) Field of Classification Search
CPC .......... H05K 3/36; H05K 3/284; H01L 23/28; H01L 23/5383; H01L 23/49822; H01L 23/49816; H01L 23/5389; H01L 23/552
USPC ....... 361/761, 767, 790–795, 816, 818, 760, 361/764, 772–774; 174/520; 257/660–690, 787–790
See application file for complete search history.

(56) References Cited

U.S. PATENT DOCUMENTS

| | | | | |
|---|---|---|---|---|
| 2009/0091904 | A1* | 4/2009 | Hatanaka | H03H 9/0542 361/764 |
| 2010/0224396 | A1* | 9/2010 | Nomiya | B32B 3/08 156/89.12 |
| 2011/0248389 | A1* | 10/2011 | Yorita | H01L 25/0652 257/659 |
| 2013/0020119 | A1* | 1/2013 | Yoshida | H05K 1/0218 174/260 |
| 2016/0035678 | A1* | 2/2016 | Yoo | H01L 23/3128 257/737 |
| 2016/0111375 | A1 | 4/2016 | Bair | |
| 2018/0151485 | A1* | 5/2018 | Kao | H01L 21/486 |
| 2018/0166394 | A1 | 6/2018 | Otsubo et al. | |

OTHER PUBLICATIONS

Written Opinion issued in Patent Application No. PCT/JP2018/040532 dated Jan. 15, 2019.

* cited by examiner

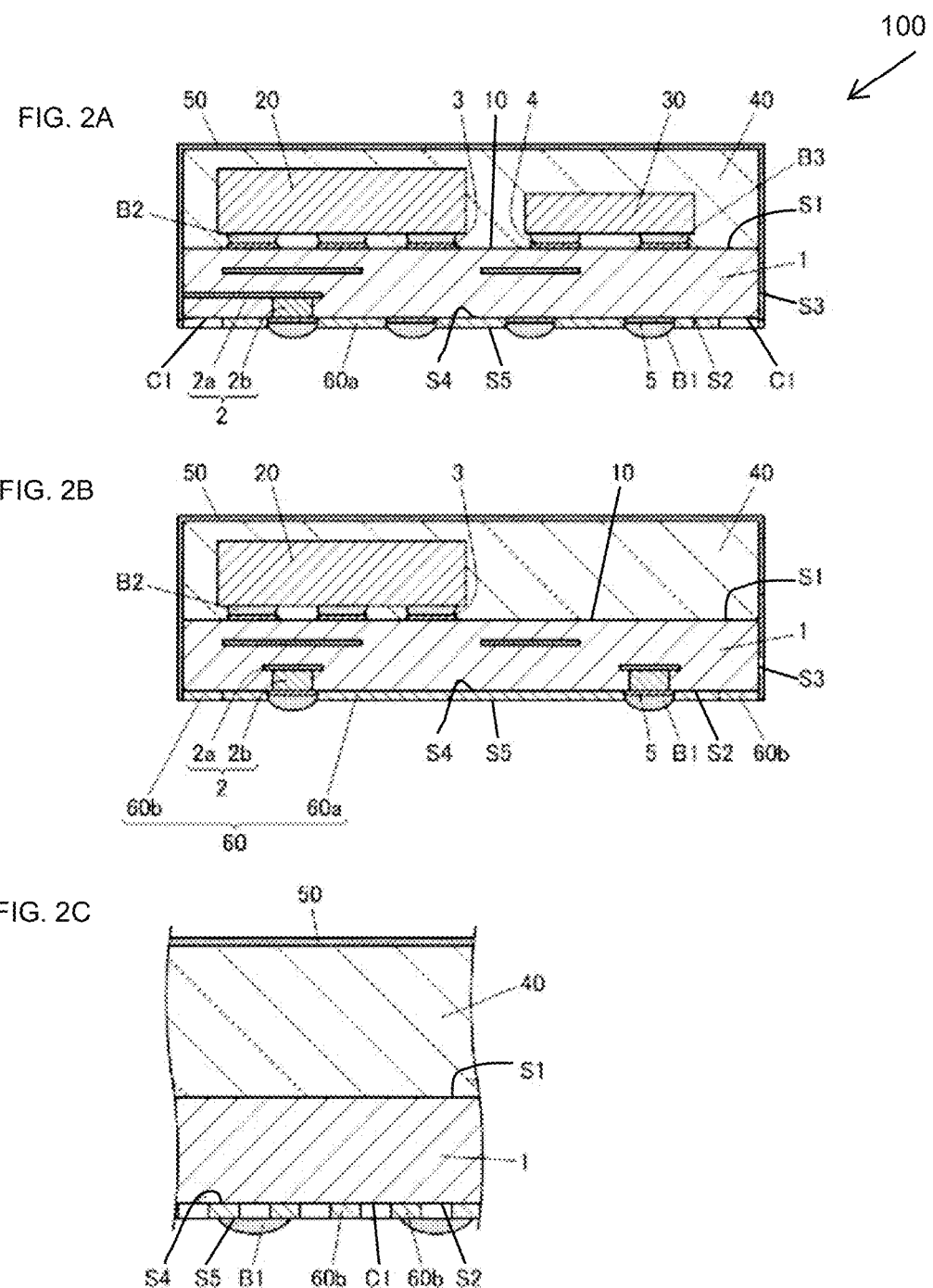

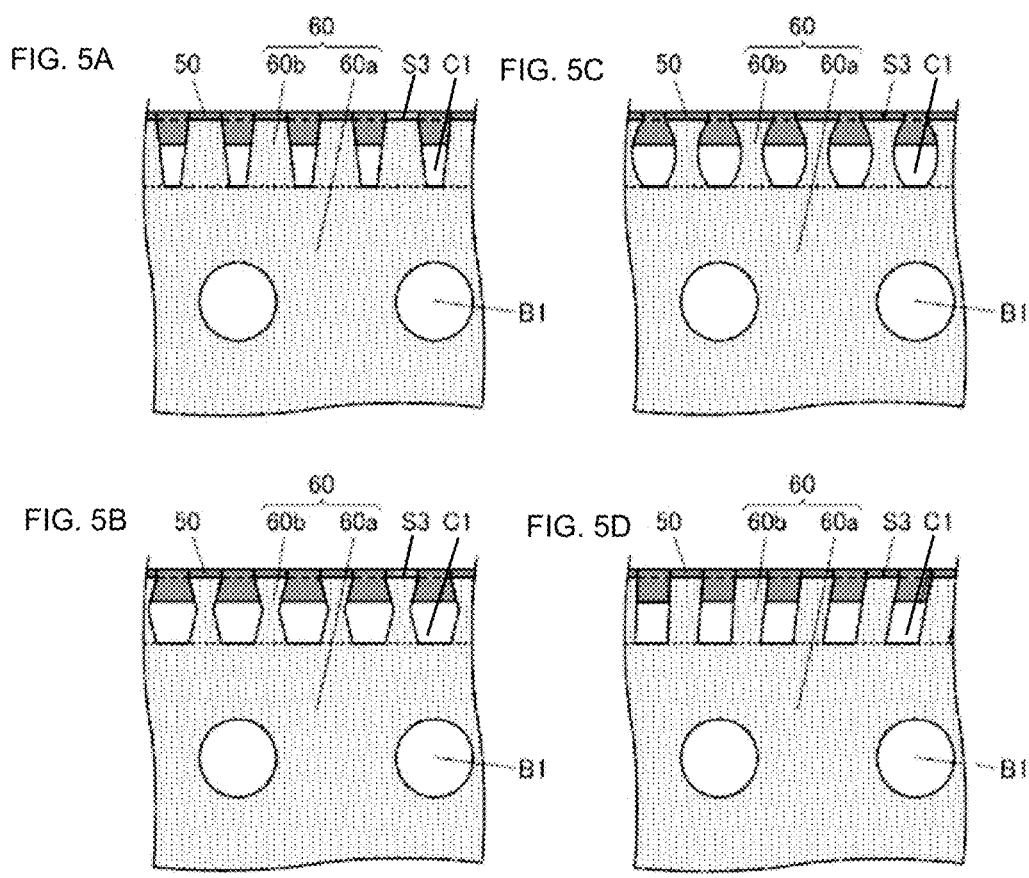

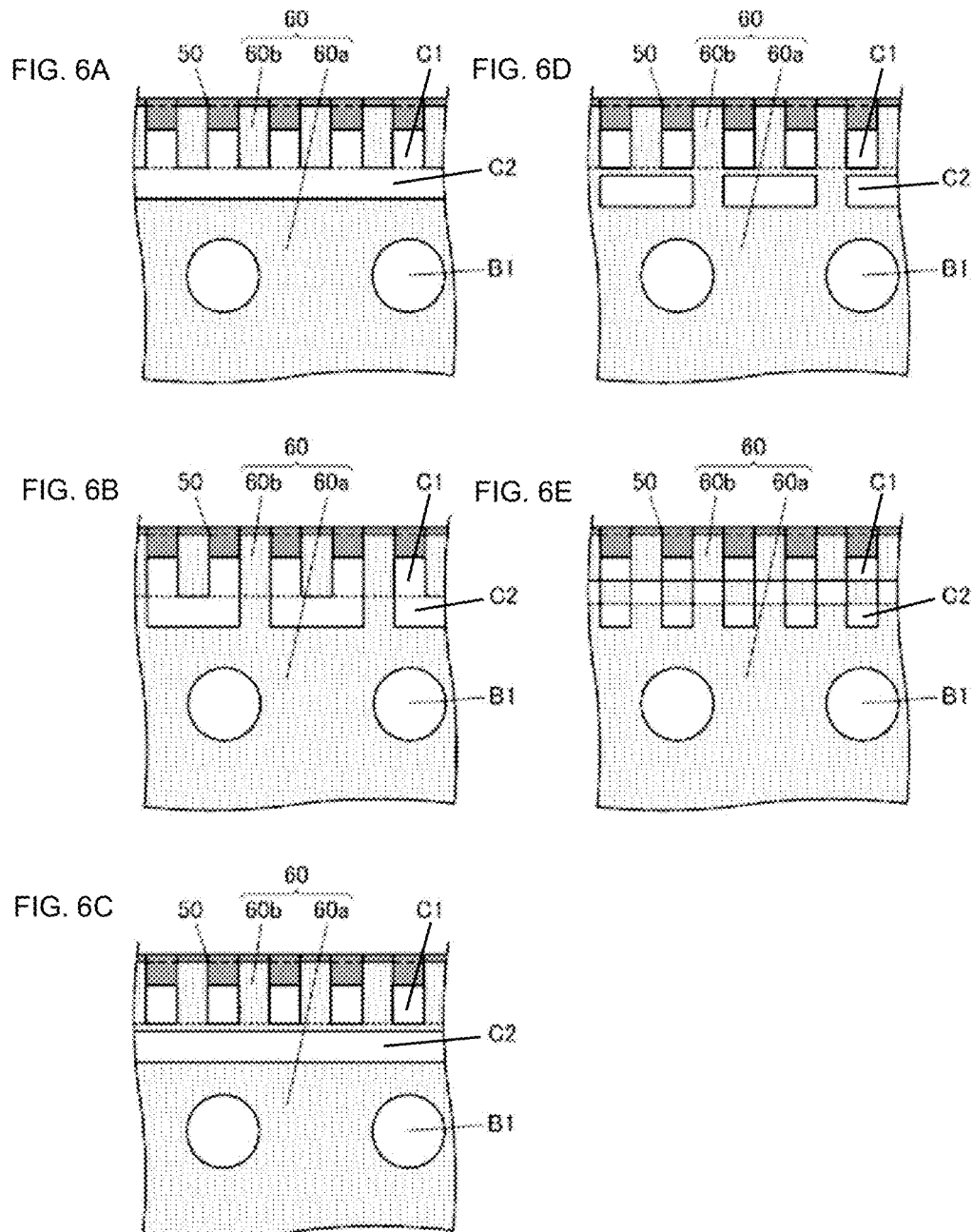

CIRCUIT MODULE

This is a continuation of International Application No. PCT/JP2018/040532 filed on Oct. 31, 2018 which claims priority from Japanese Patent Application No. 2017-213150 filed on Nov. 2, 2017. The contents of these applications are incorporated herein by reference in their entireties.

BACKGROUND OF THE DISCLOSURE

Field of the Disclosure

The present disclosure relates to a circuit module including a resin layer which is provided on one main surface of a substrate and seals an electronic component, and a conductor film which is provided on an outer surface of the resin layer.

Description of the Related Art

As a circuit module used for an electronic apparatus, a circuit module including a resin layer which is provided on one main surface of a substrate and seals an electronic component, and a conductor film which is provided on an outer surface of the resin layer is known. Examples of such a circuit module include a circuit module disclosed in U.S. Patent Application Publication No. 2016/0111375 (Patent Document 1).

Each of FIGS. 14A and 14B is an explanatory diagram according to a circuit module 200 disclosed in Patent Document 1. FIG. 14A is a cross-sectional view for explaining a part of a manufacturing process of the circuit module 200. FIG. 14B is a plan view (top view) of the circuit module 200. The circuit module 200 includes a resin layer (not illustrated) which is provided on one main surface of a substrate and seals an electronic component, a conductor film 250 which is provided on an outer surface of the resin layer, and outer electrodes 200B.

As illustrated in FIG. 14A, a semifinished product of the circuit module 200 before the conductor film 250 is formed is stuck to a base BL to which an adhesive layer is applied. In this state, to an outer surface excluding a bottom surface of the semifinished product, metallizing is performed by causing metal fine particles to adhere, for example, through sputtering. With this, the conductor film 250 is provided on the outer surface excluding the bottom surface of the semifinished product. Thereafter, by being peeled off from the base BL, the circuit module 200 becomes a finished product.

Patent Document 1: U.S. Patent Application Publication No. 2016/0111375

BRIEF SUMMARY OF THE DISCLOSURE

Incidentally, as illustrated in FIG. 14A, in the metallizing process, an excess conductor film 250s adheres on the adhesive layer. When peeling off the circuit module 200 from the base BL, most of this excess conductor film 250s remains on the adhesive layer.

However, as illustrated in FIG. 14B, there is a risk that a part of the excess conductor film 250s will become a so-called burr 250b and will adhere to the circuit module 200. In a case where the circuit module 200 as described above is connected to a circuit substrate of an electronic apparatus, there is a risk that failure will occur in the electronic apparatus, such as occurrence of a short circuit or the like by this burr 250b coming off and adhering so as to span across the outer electrodes 200B.

That is, it is an object of the present disclosure to provide a circuit module in which the adhesion of burrs is suppressed.

In a circuit module according to the present disclosure, in order to suppress the adhesion of burrs, a structure of a lower surface (a surface on which outer electrodes are provided) of the circuit module is improved.

A first aspect of a circuit module according to the present disclosure includes: a substrate including a plurality of inner conductors; a first electronic component arranged on one main surface of the substrate; a first resin layer provided on the one main surface and configured to seal the first electronic component; a plurality of outer electrodes provided on another main surface of the substrate and including a ground electrode; a conductor film provided at least on an outer surface of the first resin layer and a side surface of the substrate and connected to the ground electrode with at least one of the plurality of inner conductors interposed therebetween; and a resin film. The resin film includes a first resin film provided on the other main surface and a plurality of second resin films provided so as to extend from the first resin film in an outer side portion relative to the first resin film in a plane direction of the substrate. The plurality of outer electrodes is arranged so as to be exposed from the first resin film. When attention is paid to arbitrary adjacent two of the second resin films among the plurality of second resin films, the two second resin films are arranged so as to be spaced from each other.

A second aspect of a circuit module according to the present disclosure includes: a substrate including a plurality of inner conductors; a first electronic component arranged on one main surface of the substrate; a second electronic component arranged on another main surface of the substrate; a plurality of via conductors connected to the other main surface of the substrate; a first resin layer provided on the one main surface and configured to seal the first electronic component; a second resin layer provided on the other main surface and configured to seal the second electronic component and the plurality of via conductors; a plurality of outer electrodes provided on the second resin layer and including a ground electrode; a conductor film provided at least on an outer surface of the first resin layer, the side surface, and a side surface of the second resin layer and connected to the ground electrode with at least one of the plurality of inner conductors and at least one of the plurality of via conductors interposed therebetween; and a resin film. The resin film includes a first resin film provided on the second resin layer and a plurality of second resin films provided so as to extend from the first resin film in an outer side portion relative to the first resin film in a plane direction of the substrate. The plurality of outer electrodes is arranged so as to be exposed from the first resin film. When attention is paid to arbitrary adjacent two of the second resin films among the plurality of second resin films, the two second resin films are arranged so as to be spaced from each other.

A third aspect of a circuit module according to the present disclosure includes: a substrate including a plurality of inner conductors; a first electronic component arranged on one main surface of the substrate; a second electronic component arranged on another main surface of the substrate; a plurality of via conductors connected to the other main surface of the substrate; a first resin layer provided on the one main surface and configured to seal the first electronic component; a second resin layer provided on the other main surface and configured to seal the second electronic component and the plurality of via conductors; a plurality of outer electrodes provided in the second resin layer and including a ground electrode; and a conductor film provided at least on an outer surface of the first resin layer, the side surface, and a side surface of the second resin layer and connected to the ground electrode with at least one of the plurality of inner conductors and at least one of the plurality of via conductors interposed therebetween. The plurality of outer electrodes is arranged so as to be exposed from the second resin layer. On a surface of the second resin layer, a first projecting portion and a plurality of second projecting portions provided so as to extend from the first projecting portion in an outer side portion in the plane direction of the substrate are formed. When attention is paid to arbitrary adjacent two of the second projecting portions among the plurality of second projecting portions, the two second projecting portions are arranged so as to be spaced from each other.

In a circuit module according to the present disclosure, the adhesion of burrs is suppressed.

BRIEF DESCRIPTION OF THE SEVERAL VIEWS OF THE DRAWINGS

FIGS. 2A, 2B and 2C include, of the circuit module 100, cross-sectional views when viewed in an arrow direction, taken by respectively cutting along a plane including an X1-X1 line and a plane including an X2-X2 line illustrated in FIG. 1, and an enlarged cross-sectional view taken by cutting along a plane including an X3-X3 line.

FIGS. 5A, 5B, 5C and 5D include plan views (bottom views) for explaining third to sixth modifications of the circuit module 100.

FIGS. 6A, 6B, 6C, 6D and 6E include plan views (bottom views) for explaining seventh to eleventh modifications of the circuit module 100.

DETAILED DESCRIPTION OF THE DISCLOSURE

Figure 1:
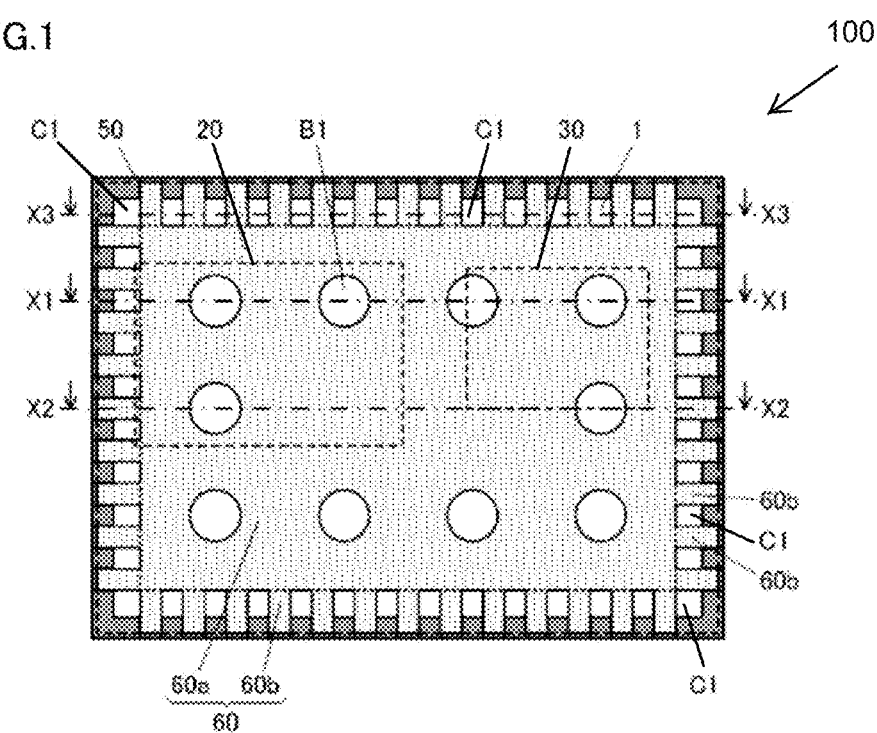
FIG. 1 is a plan view (bottom view) of a circuit module 100 which is a first embodiment of a circuit module according to the present disclosure.

Hereinafter, the features of the present disclosure will be described in more detail through the description of embodiments of the present disclosure. The present disclosure is applied to, for example, a circuit module or the like used for an electronic apparatus for which high reliability is required, such as an on-vehicle apparatus or the like, but is not limited thereto.

First Embodiment of Circuit Module

The structure and features of a circuit module 100 which is a first embodiment of a circuit module according to the present disclosure will be described with reference to FIG. 1 to FIG. 3C.

Note that each of the drawings is a schematic diagram. Additionally, variations in shapes of constituent elements or the like generated in a manufacturing process are not necessarily reflected in the drawings. That is, hereinafter, the drawings used for the description in this specification can be considered as representing the actual product in an essential aspect, even if there is a different part from that of the actual product.

FIG. 1 is a plan view (bottom view) of the circuit module 100. FIGS. 2A, 2B and 2C include various cross-sectional views of the circuit module 100. FIG. 2A is a cross-sectional view of the circuit module 100, when viewed in an arrow direction, taken by cutting along a plane including an X1-X1 line illustrated in FIG. 1. FIG. 2B is a cross-sectional view of the circuit module 100, when viewed in an arrow direction, taken by cutting along a plane including an X2-X2 line. FIG. 2C is an enlarged cross-sectional view illustrating, in an enlarged manner, a primary part of a cross-sectional view of the circuit module 100, when viewed in an arrow direction, taken by cutting along a plane including an X3-X3 line.

Note that although FIG. 1 is not a cross-sectional view, in order to facilitate understanding of constituent members, some constituent members are shaded.

The circuit module 100 includes a substrate 10, a first electronic components 20 and 30, a first resin layer 40, a plurality of outer electrodes B1, a conductor film 50, and a resin film 60. The substrate 10 has a one main surface S1, another main surface S2, and a side surface S3 connecting the one main surface S1 and the other main surface S2 (see FIG. 2A).

In the circuit module 100 illustrated in FIG. 1, the substrate 10 has a rectangular shape in a plan view. Furthermore, the substrate 10 includes an insulator layer 1 and a plurality of inner conductors 2 formed therein. The inner conductor 2 includes a pattern conductor 2a and a via conductor 2b. For the insulator layer 1, for example, a material selected from a low-temperature fired ceramic material, a composite material of glass fibers and an epoxy resin, and the like is used. For the inner conductor 2, a metal material such as Cu or the like, for example, is used.

On the one main surface S1 of the substrate 10, lands 3 and 4 are provided. Furthermore, on the other main surface S2, lands 5 are provided.

The first electronic components 20 and 30 are, for example, various electronic components such as an integrated circuit, a multilayer capacitor and a multilayer inductor, or the like. The first electronic component 20 is connected to the land 3 with a connection member B2 such as, for example, Pb-free solder or the like. The first electronic component 30 is connected to the land 4 with a similar connection member B3. That is, the first electronic components 20 and 30 are connected to the one main surface S1 side of the substrate 10.

The first resin layer 40 is provided on the one main surface S1 and seals the first electronic components 20 and 30. For the first resin layer 40, a resin material in which a glass material, silica, or the like is dispersed as a filler is used. Note that the filler may not be contained.

The plurality of outer electrodes B1 includes a signal electrode and a ground electrode. For the plurality of outer electrodes B1, for example, solder bumps or the like including Pb-free solder are used. In the circuit module 100, the plurality of outer electrodes B1 is provided on the respective lands 5. Note that the outer electrode may also be provided directly on the via conductor 2b exposed on the other main surface S2. That is, the plurality of outer electrodes B1 is provided on the other main surface S2 side.

The conductor film 50 is provided on the outer surface of the first resin layer 40, on the side surface S3, and on the vicinity of the outer perimeter of the other main surface S2, and is connected to the ground electrode with at least one of the plurality of inner conductors 2 being interposed therebetween. For the conductor film 50, a metal material such as Cu or the like, for example, is used. The conductor film 50 at the side surface of the circuit module 100 is applied with a thickness equal to or more than 2 μm in order to obtain a sufficient shield effect. Note that the conductor film 50 may be formed by laminating a plurality of layers of different kinds of metal films. A forming process of the conductor film 50 will be described later.

The resin film 60 includes a first resin film 60a and a plurality of second resin films 60b, each provided on the other main surface S2 of the substrate 10. The first resin film 60a has a surface S4 which is in contact with the other main surface S2 and a surface S5 which faces the surface S4. The second resin film 60b has one end flush with the side surface S3 and the other end extending so as to separate from the side surface S3.

In the circuit module 100 illustrated in FIG. 2B, the second resin film 60b extends in a direction orthogonal to the side surface S3 of the substrate 10. The other end of the second resin film 60b reaches the first resin film 60a, and the first resin film 60a and the second resin film 60b are integrated with each other. Additionally, although the first resin film 60a and the second resin film 60b have the same thickness, the configuration is not limited thereto.

Note that as illustrated in the modifications described later, the extending direction of the second resin film 60b need not be the direction orthogonal to the side surface S3. Furthermore, the first resin film 60a and the second resin film 60b need not be integrated. For the resin film 60, a resin material such as an epoxy resin, for example, is used.

The plurality of outer electrodes B1 is arranged, in an inner side portion of the outer perimeter of the surface S5 of the first resin film 60a, so as to be exposed from the surface S5, in a plan view in the normal direction of the other main surface S2 of the substrate 10 (in a plan view viewed from the lower surface side of the circuit module 100) (see FIG. 1). The plurality of second resin films 60b is arranged such that a first gap C1 is present between two adjacent second resin films 60b (see FIG. 1). The depth of the first gap C1, that is, the thickness of the second resin film 60b is equal to or more than 25 μm.

The first gaps C1 need not have the same form, and need not have the same width, between all the two adjacent second resin films 60b. For example, in the circuit module 100 illustrated in FIG. 1, in the plurality of second resin films 60b in contact with the four sides of the rectangular first resin film 60a, all the first gaps C1 have the same width. On the other hand, the first gap C1 between the two second resin films 60b located at the corner portion of the first resin film 60a is different in shape from the first gaps C1 on the above-described respective sides, and is also different in width therefrom.

Figure 3A:
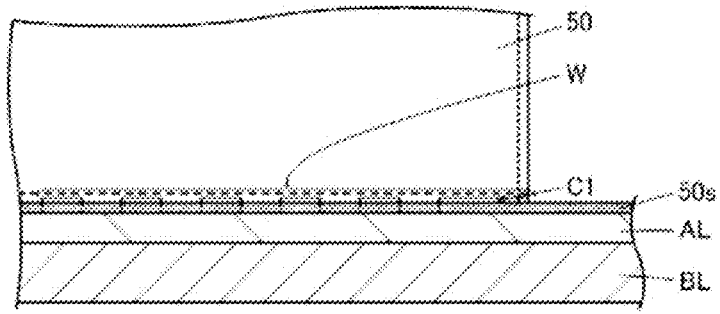
FIGS. 3A, 3B and 3C include enlarged cross-sectional views for explaining a process in which a semifinished product is provided with a conductor film 50 and then peeled off from a base BL in a manufacturing process of the circuit module 100, and a plan view (top view) of the circuit module 100 after being peeled off from the base BL.
Figure 3B:
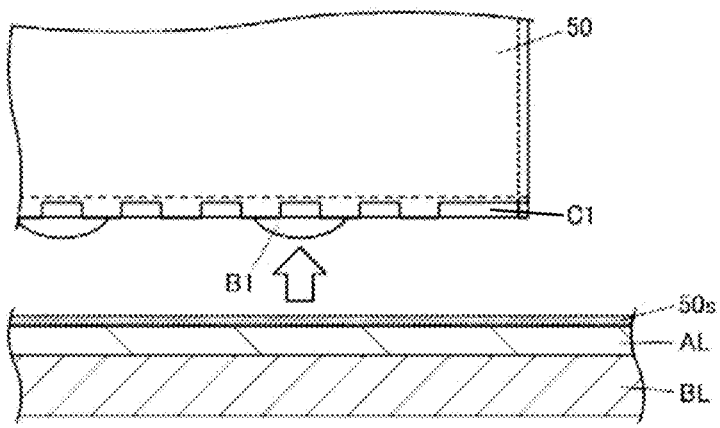
Figure 3C:
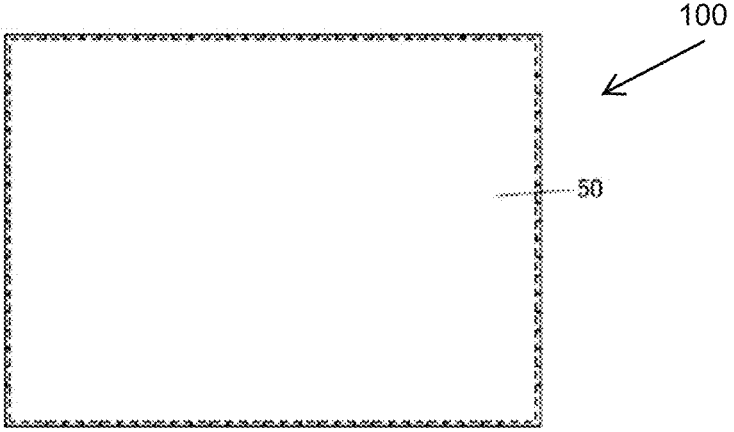

Here, a forming process of the conductor film 50 in the manufacturing process of the circuit module 100 will be described with reference to FIGS. 3A, 3B and 3C. FIGS. 3A, 3B and 3C include enlarged cross-sectional views for explaining a process in which a semifinished product is provided with the conductor film 50 and then peeled off from a base BL in the manufacturing process of the circuit module 100. The description of other processes such as a connection process of the first electronic components 20 and 30 to the substrate 10, an application process of the resin film 60 (first resin film 60a and second resin film 60b), and the like will be omitted.

FIG. 3A illustrates a process in which the conductor film 50 is applied to the semifinished product to which the first resin film 60a and the second resin film 60b are applied. The semifinished product of the circuit module 100 to which the conductor film 50 is not applied is stuck to the base BL to which an adhesive layer AL is applied. The outer electrodes B1 sink into the adhesive layer AL, and further the first resin film 60a and the plurality of second resin films 60b are in contact with the adhesive layer AL.

As described above, the plurality of second resin films 60b has the one ends flush with the side surface S3 and is arranged such that the first gap C1 is present between the two adjacent second resin films 60b (see FIG. 1).

Next, on the outer surface of the first resin layer 40, on the side surface S3 of the substrate 10, and on the one end of the second resin films 60b, metallizing is performed by causing metal fine particles to adhere, for example, through sputtering. With this, the conductor film 50 is applied to the above-described portions. At this time, the conductor film 50 is also formed on the other main surface S2 of the substrate 10 exposed by the presence of the first gap C1 so as to come around (see FIG. 2A).

Furthermore, the metal fine particles generated by the sputtering also adhere to the outer surface of the adhesive layer AL, and become an excess conductor film 50s connected to the conductor film 50. Note that as illustrated in FIG. 3A, a space in which the conductor film 50 is not formed remains in the first gap C1. As a result, in the conductor film 50, a window portion W which is arranged like perforations and which is not connected to the excess conductor film 50s is generated.

Then, as illustrated in FIG. 3B, when the circuit module 100 to which the conductor film 50 is applied is peeled off from the base BL, the window portion W serves as a starting point, and a portion where the conductor film 50 and the excess conductor film 50s are in contact is broken. As a result, the circuit module 100 in which the adhesion of the excess conductor film 50s (so-called burr) is suppressed as illustrated in the plan view (top view) of FIG. 3C is obtained. That is, in the circuit module 100 as described above, the occurrence of failure in the electronic apparatus due to the burrs is suppressed.

In order to suppress the adhesion of the burrs, in a case where the conductor film 50 on the side surface of the circuit module 100 is applied with a thickness of equal to or more than 2 μm, it is preferable that the width and pitch of the first gap C1 be equal to or less than 200 μm.

<<Modifications of First Embodiment of Circuit Module>>

Various modifications of the circuit module 100 which is the first embodiment of the circuit module according to the present disclosure will be described with reference to FIG. 4A to FIG. 9. Note that the description of constituent elements of each of the modifications common to those of the circuit module 100 may be omitted or simplified.

<First and Second Modifications>

Figure 4A:
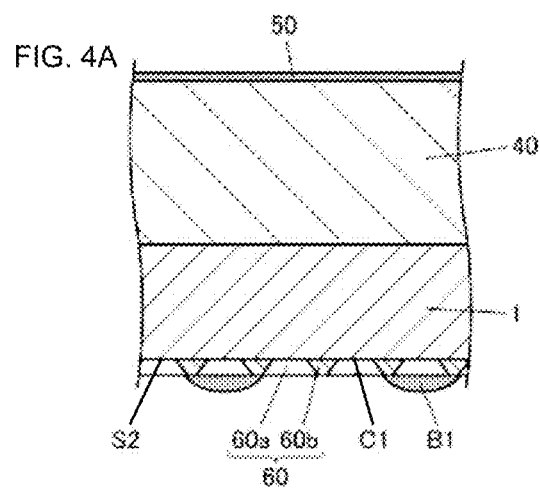
FIGS. 4A and 4B include enlarged cross-sectional views for explaining first and second modifications of the circuit module 100.

First and second modifications of the circuit module 100 will be described with reference to FIGS. 4A and 4B. FIG. 4A is an enlarged cross-sectional view, which corresponds to FIG. 2C, for explaining the first modification of the circuit module 100. In the first modification illustrated in FIG. 4A, a cross section of the second resin film 60b orthogonal to the extending direction has a tapered shape in which the length of a side which is in contact with the other main surface S2 of the substrate 10 is longer than the length of a side facing the side.

In this case, since the length of the portion where the conductor film 50 and the excess conductor film 50s are in contact with each other is short, breakage of both of them is easy to progress. Accordingly, the adhesion of the burrs to the circuit module 100 is further suppressed. Furthermore, since the area of the surface of the second resin film 60b which is in contact with the other main surface S2 is larger than the area of the surface facing it, even in a case where the cross-sectional area of the second resin film 60b is small, peeling from the other main surface S2 is suppressed.

Figure 4B:
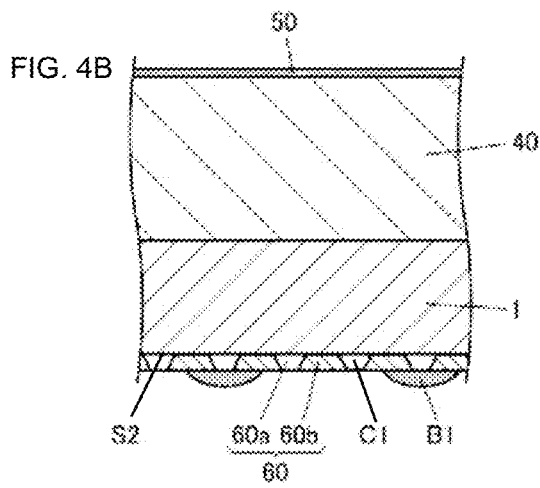

On the other hand, FIG. 4B is an enlarged cross-sectional view, which corresponds to FIG. 2C, for explaining the second modification of the circuit module 100. In the second modification illustrated in FIG. 4B, a cross section of the second resin film 60b orthogonal to the extending direction has a tapered shape, in a direction opposite to that of the first modification, in which the length of a side which is in contact with the other main surface S2 of the substrate 10 is shorter than the length of a side facing the side.

In this case, since the metal fine particles at the time of the sputtering is suppressed from coming around an inner wall of the first gap C1, the excess conductor film 50s is less likely to be applied to the inner wall of the first gap C1. Accordingly, the breakage between the conductor film 50 and the excess conductor film 50s is easy to progress. Accordingly, the adhesion of the burrs to the circuit module 100 is further suppressed.

<Third to Sixth Modifications>

Third to sixth modifications of the circuit module 100 will be described with reference to FIGS. 5A, 5B, 5C and 5D. FIG. 5A is a plan view (bottom view) for explaining the third modification of the circuit module 100. In the third modification illustrated in FIG. 5A, the second resin film 60b has a tapered shape in the extending direction in which the area of the cross section orthogonal to the extending direction increases as separating from the side surface S3 of the substrate 10.

Note that the direction of the tapered shape may be a direction opposite to that illustrated in FIG. 5A. Furthermore, the tapered shape linearly changes in the plan view, but may change in a curved manner.

FIG. 5B is a plan view (bottom view) for explaining the fourth modification of the circuit module 100. In the fourth modification illustrated in FIG. 5B, in the second resin film 60b, up to a certain distance, the area of the cross section orthogonal to the extending direction decreases as separating from the side surface S3 of the substrate. Then, in a portion subsequent thereto, the area of the cross section orthogonal to the extending direction increases as separating from the side surface S3 of the substrate 10. Note that this shape changes in a polygonal line shape in the plan view.

Furthermore, contrary to that illustrated in FIG. 5B, the area of the cross section of the second resin film 60b orthogonal to the extending direction may increase, up to a certain distance, as separating from the side surface S3 of the substrate, and may decrease in a portion subsequent thereto.

FIG. 5C is a plan view (bottom view) for explaining the fifth modification of the circuit module 100. In the fifth modification illustrated in FIG. 5C, the area of the cross section of the second resin film 60b changes, in the same manner as the fourth modification, as separating from the side surface S3 of the substrate 10. Note that the shape changes in a curved manner in the plan view.

FIG. 5D is a plan view (bottom view) for explaining the sixth modification of the circuit module 100. In the sixth modification illustrated in FIG. 5D, the second resin film 60b extends in a direction inclined from the normal direction of the side surface S3.

In the circuit module 100 illustrated in FIG. 5D, the extending direction of the second resin film 60b is not constant, and the inclination from the normal direction of the side surface S3 increases as approaching the corner portion of the rectangular other main surface S2 of the substrate 10. Note that the inclination from the normal direction of the side surface S3 may be constant.

The third to sixth modifications of the circuit module 100 also have the same effect as that of the first embodiment. In the third modification, in a case where the direction of the tapered shape of the second resin film 60b is that illustrated in FIG. 5A, the second resin film 60b is suppressed from being peeled off from the other main surface S2. Furthermore, since the length of the portion where the conductor film 50 and the excess conductor film 50s are in contact with each other is short, breakage of both of them is easy to progress. Accordingly, the adhesion of the burrs to the circuit module 100 is further suppressed.

On the other hand, in a case where the direction of the tapered shape is a direction opposite to that illustrated in FIG. 5A, the first gap C1 at the side surface S3 of the substrate 10 is narrowed. Accordingly, the metal fine particles at the time of the sputtering is suppressed from sneaking into the first gap C1.

In the fourth and fifth modifications, in a case where the cross-sectional area of the second resin film 60b changes as illustrated in FIGS. 5B and 5C, the first gap C1 at the side surface S3 of the substrate 10 is narrowed. Accordingly, the metal fine particles at the time of the sputtering is suppressed from sneaking into the first gap C1.

On the other hand, in a case where the cross-sectional area of the second resin film 60b inversely changes to that illustrated in FIGS. 5B and 5C, since the length of the portion where the conductor film 50 and the excess conductor film 50s are in contact with each other is short, breakage of both of them is easy to progress. Accordingly, the adhesion of the burrs to the circuit module 100 is further suppressed.

In the case of the sixth modification, the second resin film 60b is suppressed from being peeled off from the other main surface S2.

<Seventh to Eleventh Modifications>

Seventh to eleventh modifications of the circuit module 100 will be described with reference to FIGS. 6A, 6B, 6C, 6D and 6E. FIG. 6A is a plan view (bottom view) for explaining the seventh modification of the circuit module 100. In the seventh modification illustrated in FIG. 6A, in a peripheral edge portion of the first resin film 60a, a second gap C2 arranged in parallel with the outer perimeter of the first resin film 60a is present. That is, the first resin film 60a and the second resin film 60b are not integrated with each other.

FIG. 6B is a plan view (bottom view) for explaining the eighth modification of the circuit module 100. In the eighth modification illustrated in FIG. 6B as well, in the peripheral edge portion of the first resin film 60a, the second gap C2 arranged in parallel with the outer perimeter of the first resin film 60a is present. Note that the second gap C2 has a broken line shape, and the plurality of second resin films 60b is integrated with the first resin film 60a every other one.

FIG. 6C is a plan view (bottom view) for explaining the ninth modification of the circuit module 100. In the ninth modification illustrated in FIG. 6C, in the first resin film 60a, the second gap C2 arranged in parallel with the outer perimeter of the first resin film 60a is present. That is, the first resin film 60a and the second resin film 60b are integrated with each other. Note that the peripheral edge portion of the first resin film 60a where the other end of the second resin film 60b reaches and the center portion of the first resin film 60a in which the plurality of outer electrodes B1 is arranged are isolated by the second gap C2.

FIG. 6D is a plan view (bottom view) for explaining the tenth modification of the circuit module 100. In the tenth modification illustrated in FIG. 6D as well, in the first resin film 60a, the second gap C2 arranged in parallel with the outer perimeter of the first resin film 60a is present. Note that the second gap C2 has a broken line shape. That is, the peripheral edge portion of the first resin film 60a where the other end of the second resin film 60b reaches and the center portion of the first resin film 60a in which the plurality of outer electrodes B1 is arranged are not isolated by the second gap C2.

FIG. 6E is a plan view (bottom view) for explaining the eleventh modification of the circuit module 100. In the eleventh modification illustrated in FIG. 6E, in the peripheral edge portion and the inside of the first resin film 60a, the second gap C2 having a broken line shape is present. Note that the second gap C2 is arranged alternately with a part of the first resin film 60a in each of the array direction and the extending direction of the plurality of second resin films 60b. That is, a part of the first resin film 60a and the second gap C2 having a broken line shape are arranged so as to form a check pattern.

In the seventh to eleventh modifications of the circuit module 100 as well, the same effect as that of the first embodiment can be obtained. Furthermore, by the second gap C2, a short circuit between the conductor film 50 and the signal electrode is suppressed from occurring. Note that the second gap C2 may be arranged in an inclined state, instead of being parallel to the outer perimeter of the first resin film 60a.

Figure 7A:
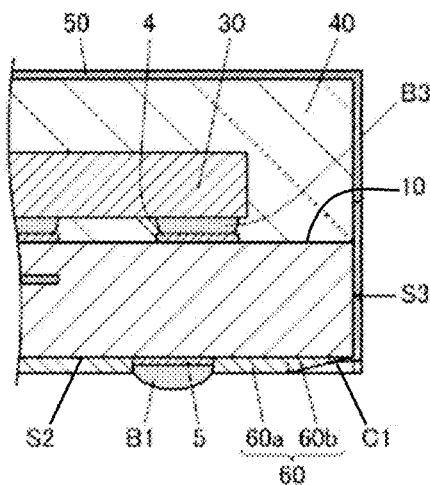
FIGS. 7A and 7B include enlarged cross-sectional views for explaining twelfth and thirteenth modifications of the circuit module 100.

Twelfth and thirteenth modifications of the circuit module 100 will be described with reference to FIGS. 7A and 7B. FIG. 7A is an enlarged cross-sectional view, which corresponds to FIG. 2C, for explaining the twelfth modification of the circuit module 100. A plan view (bottom view) of the twelfth modification is similar to that of the circuit module 100 illustrated in FIG. 1. Note that in the twelfth modification, the cross section of the second resin film 60b parallel to the extending direction thereof and orthogonal to the other main surface S2 has a tapered shape in which the thickness decreases from a portion in contact with the first resin film 60a toward the side surface S3.

Figure 7B:
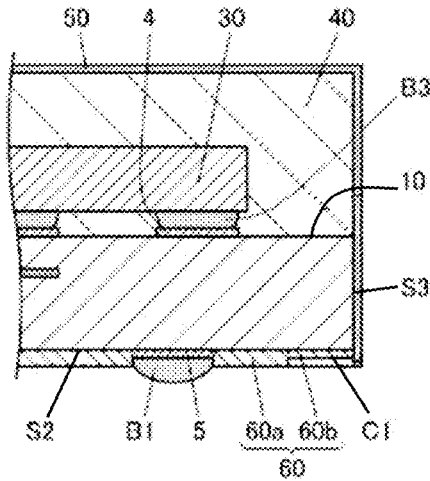

FIG. 7B is an enlarged cross-sectional view, which corresponds to FIG. 2C, for explaining the thirteenth modification of the circuit module 100. A plan view (bottom view) of the thirteenth modification is also similar to that of the circuit module 100 illustrated in FIG. 1. Note that in the thirteenth modification, the thickness of the second resin film 60b is smaller than that of the first resin film 60a.

In the twelfth and thirteenth modifications of the circuit module 100 as well, the same effect as that of the first embodiment can be obtained.

Figure 8:
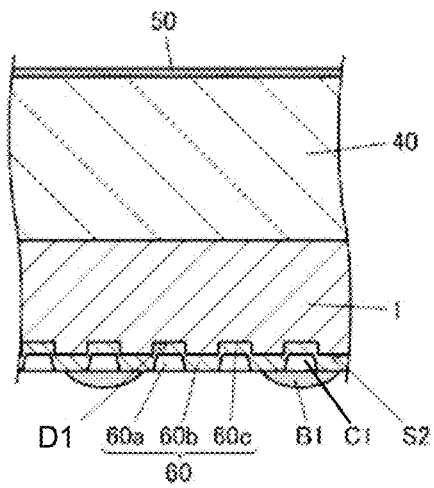
FIG. 8 is an enlarged cross-sectional view for explaining a fourteenth modification of the circuit module 100.

A fourteenth modification of the circuit module 100 will be described with reference to FIG. 8. FIG. 8 is an enlarged cross-sectional view, which corresponds to FIG. 2C, for explaining the fourteenth modification of the circuit module 100. In the fourteenth modification illustrated in FIG. 8, the resin film 60 further includes a third resin film 60c for connecting two adjacent second resin films 60b to each other, in addition to the first resin film 60a and the second resin film 60b.

Furthermore, the other main surface S2 of the substrate 10 has a recessed portion D1. The third resin film 60c enters into the recessed portion D1. In this case as well, arrangement is performed such that the first gap C1 is present between the two adjacent second resin films 60b.

Note that the thickness of the third resin film 60c may be a thickness that the first gap C1 is obtained in a state in which the third resin film 60c has entered into the recessed portion D1. That is, it is not necessary for the thickness of the third resin film 60c to be smaller than the thickness of the first resin film 60a and the thickness of the second resin film 60b.

In the fourteenth modification as well, the same effect as that of the first embodiment can be obtained. Furthermore, in the fourteenth modification, the two adjacent second resin films 60b are connected to each other by the third resin film 60c which enters into the recessed portion D1 and is firmly connected to the other main surface S2. Accordingly, the second resin film 60b is suppressed from being peeled off from the other main surface S2.

Figure 9:
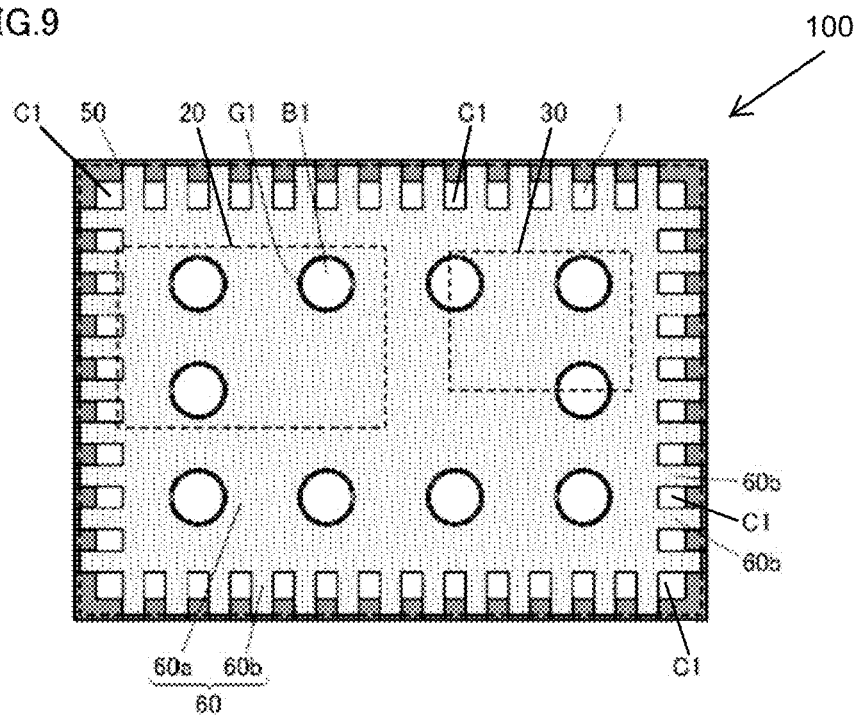
FIG. 9 is a plan view (bottom view) for explaining a fifteenth modification of the circuit module 100.

A fifteenth modification of the circuit module 100 will be described with reference to FIG. 9. FIG. 9 is a plan view (bottom view), which corresponds to FIG. 1, for explaining the fifteenth modification of the circuit module 100. In the fifteenth modification illustrated in FIG. 9, in addition to the configuration of the circuit module 100, an annular gap G1 is provided around the outer electrode B1.

In the fifteenth modification of the circuit module 100 as well, the same effect as that of the first embodiment can be obtained. Furthermore, even if the sputtering is performed in a state where the substrate 10 is inclined relative to the base BL, the metal fine particles are suppressed from coming around the inner wall of the gap G1. As a result, a short circuit between the conductor film 50 and the signal electrode is suppressed from occurring.

Second Embodiment of Circuit Module

The structure and features of a circuit module 100A which is a second embodiment of the circuit module according to the present disclosure will be described with reference to FIG. 10, and FIGS. 11A and 11B. Note that the description of constituent elements of the circuit module 100A common to those of the circuit module 100 may be omitted or simplified.

Figure 10:
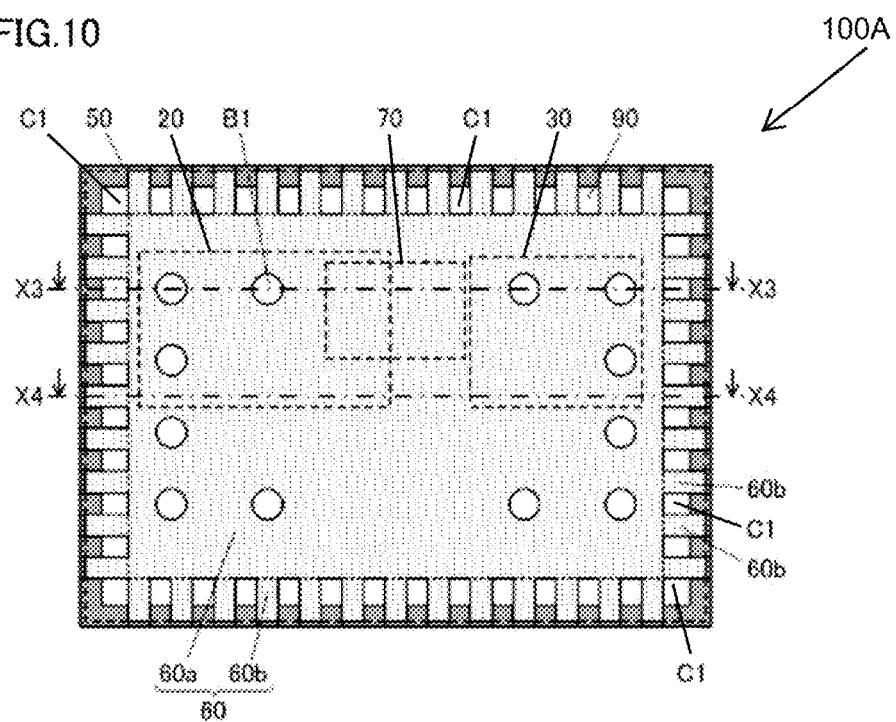
FIG. 10 is a plan view (bottom view) of a circuit module 100A which is a second embodiment of the circuit module according to the present disclosure.
Figure 11A:
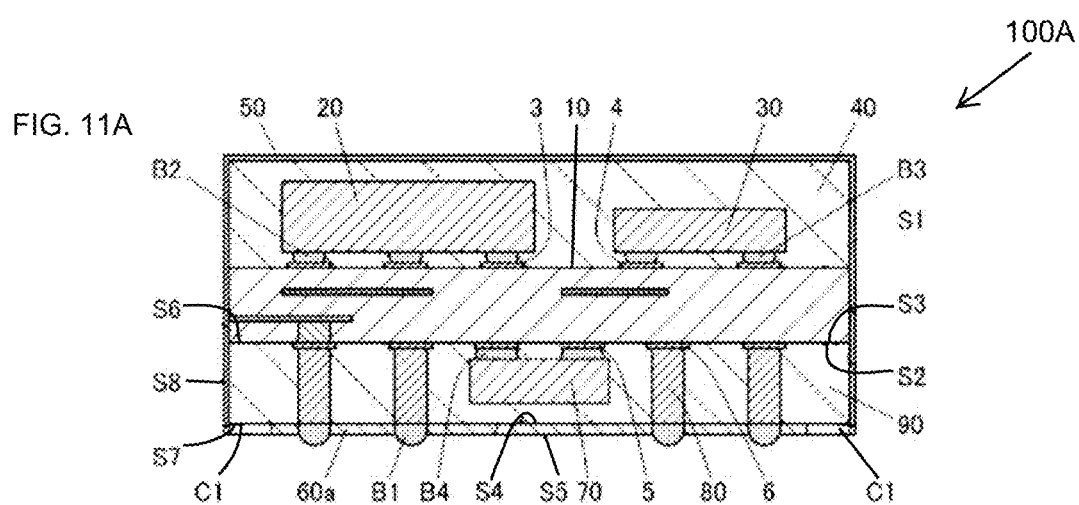
FIGS. 11A and 11B include cross-sectional views of the circuit module 100A, when viewed in an arrow direction, taken by respectively cutting along a plane including an X3-X3 line and a plane including an X4-X4 line illustrated in FIG. 10.
Figure 11B:
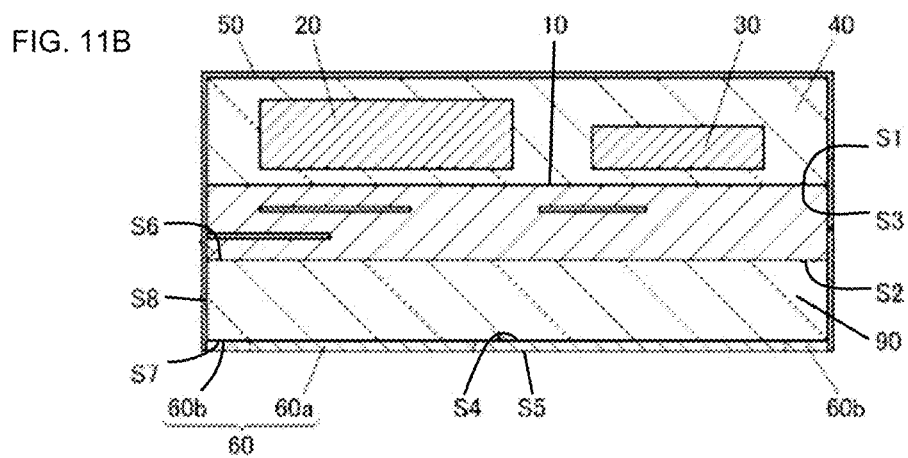

FIG. 10 is a plan view (bottom view) of the circuit module 100A. FIG. 11A is a cross-sectional view of the circuit module 100A, when viewed in an arrow direction, taken by cutting along a plane including an X3-X3 line illustrated in FIG. 10. FIG. 11B is a cross-sectional view of the circuit module 100A, when viewed in an arrow direction, taken by cutting along a plane including an X4-X4 line. Note that although FIG. 10 is not a cross-sectional view, in order to facilitate understanding of constituent members, some constituent members are shaded.

The circuit module 100A includes a second electronic component 70, a plurality of via conductors 80, and a second resin layer 90, in addition to the configuration of the circuit module 100. As the second electronic component 70, various electronic components are used in the same manner as the first electronic components 20 and 30. The second electronic component 70 is connected to the land 5 with a connection member B4 such as, for example, Pb-free solder or the like.

The end surfaces of the plurality of via conductors 80 on a side of a surface S6 are respectively connected to lands 6. The via conductor 80 may be directly formed on the land 6, or a preformed member may be connected to the land 6 with a connection member. That is, the second electronic component 70 and the plurality of via conductors 80 are connected to the other main surface S2 side of the substrate 10.

The second resin layer 90 is provided on the other main surface S2, and seals the second electronic component 70 and the plurality of via conductors 80. Furthermore, the second resin layer 90 has the surface S6 which is in contact with the other main surface S2, a surface S7 which faces the surface S6, and a surface S8 which connects the surface S6 and the surface S7. For the second resin layer 90 as well, a resin material in which a glass material, silica, or the like is dispersed as a filler is used. Note that the filler may not be contained. Furthermore, different kinds of resin materials may be used for the first resin layer 40 and the second resin layer 90.

The plurality of outer electrodes B1 includes a signal electrode and a ground electrode. For the plurality of outer electrodes B1, in the same manner as the circuit module 100, for example, solder bumps or the like including Pb-free solder are used. Note that in the circuit module 100A, the outer electrodes B1 are provided on the end surfaces of the plurality of via conductors 80 on the surface S7 side, respectively. Note that the outer electrode B1 may be provided on the end surface of the via conductor 80 on the surface S7 side with an intermediate film formed by plating or the like interposed therebetween.

The conductor film 50 is provided on the outer surface of the first resin layer 40, on the side surface S3, on the surface S8, and on the vicinity of the outer perimeter of the surface S7. Additionally, the conductor film 50 is connected to the ground electrode with at least one of the plurality of inner conductors in the substrate 10 and at least one of the plurality of via conductors 80 interposed therebetween. For the conductor film 50, a metal material such as Cu or the like, for example, is used.

The resin film 60 includes the first resin film 60a and the plurality of second resin films 60b, each provided on the surface S7 of the second resin layer 90. The first resin film 60a has the surface S4 which is in contact with the surface S7 and the surface S5 which faces the surface S4. The second resin film 60b has one end flush with the surface S8 and the other end extending so as to separate from the surface S8. For the resin film 60, a resin material such as an epoxy resin, for example, is used (see FIG. 11A).

The plurality of outer electrodes B1 is arranged, in an inner side portion of the outer perimeter of the surface S5 of the first resin film 60a, so as to be exposed from the surface S5, in a plan view in the normal direction of the surface S7 of the second resin layer 90 (in a plan view viewed from the lower surface side of the circuit module 100A) (see FIG. 10). Furthermore, the plurality of second resin films 60b is arranged such that the first gap C1 is present between two adjacent second resin films 60b (see FIG. 10).

The first gaps C1 need not have the same form, and need not have the same width, between all the two adjacent second resin films 60b, in the same manner as the circuit module 100. For example, in the circuit module 100A illustrated in FIG. 10, in the plurality of second resin films 60b in contact with the four sides of the rectangular first resin film 60a, all the first gaps C1 have the same width. On the other hand, the first gap C1 between the two second resin films 60b located at the corner portion of the first resin film 60a is different in shape from the first gaps C1 on the above-described respective sides, and is also different in width therefrom.

In the circuit module 100A as well, in the manufacturing process, the metal fine particles generated by the sputtering for forming the conductor film 50 also adhere to the outer surface of the adhesive layer AL, and become the excess conductor film 50s connected to the conductor film 50 (see FIG. 3A). Note that in the same manner as the manufacturing process of the circuit module 100, a space in which the conductor film 50 is not formed remains in the first gap C1. As a result, in the conductor film 50, the window portion W which is arranged like perforations and which is not connected to the excess conductor film 50s is generated.

Then, when the circuit module 100A to which the conductor film 50 is applied is peeled off from the base BL, the window portion W serves as a starting point, and a portion where the conductor film 50 and the excess conductor film 50s are in contact is broken. As a result, the circuit module 100A in which the adhesion of the excess conductor film 50s (so-called burr) is suppressed is obtained. That is, in the circuit module 100A as described above, the occurrence of failure in the electronic apparatus due to the burrs is suppressed.

Third Embodiment of Circuit Module

The structure and features of a circuit module 100B which is a third embodiment of the circuit module according to the present disclosure will be described with reference to FIG. 12, and FIGS. 13A and 13B. Note that the description of constituent elements of the circuit module 100B common to those of the circuit module 100A may be omitted or simplified.

Figure 12:
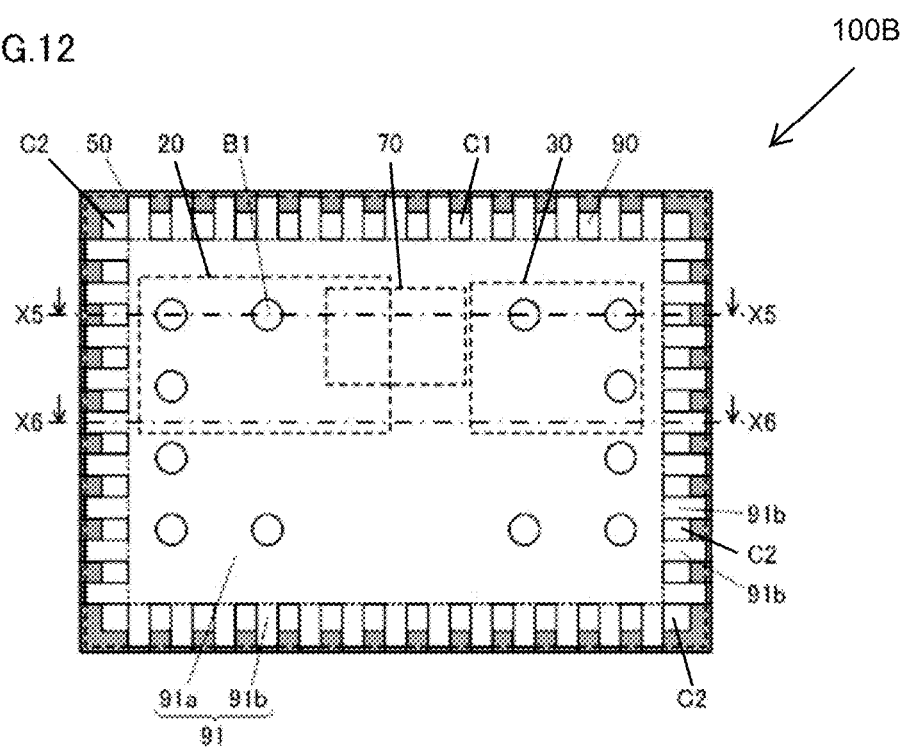
FIG. 12 is a plan view (bottom view) of a circuit module 100B which is a third embodiment of the circuit module according to the present disclosure.
Figure 13A:
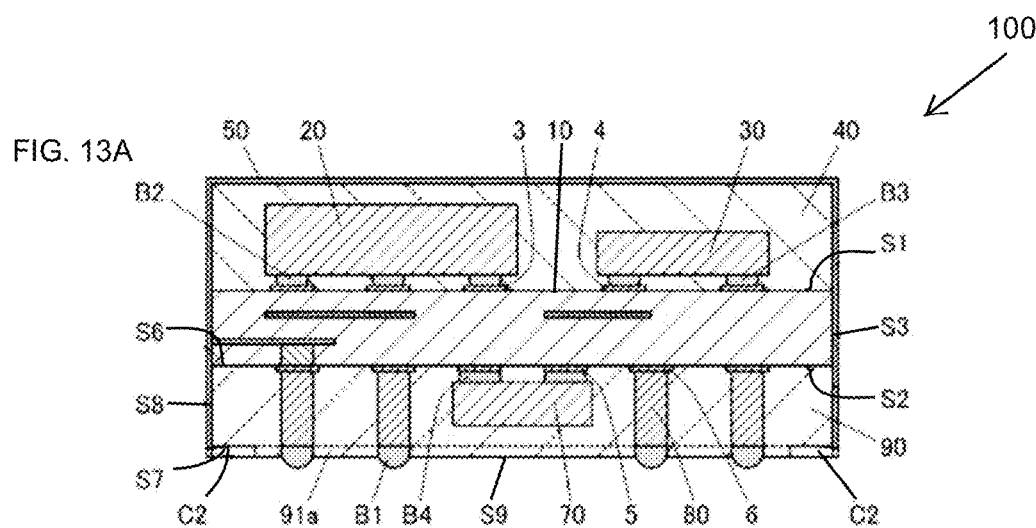
FIGS. 13A and 13B include cross-sectional views of the circuit module 100B, when viewed in an arrow direction, taken by respectively cutting along a plane including an X5-X5 line and a plane including an X6-X6 line illustrated in FIG. 12.
Figure 13B:
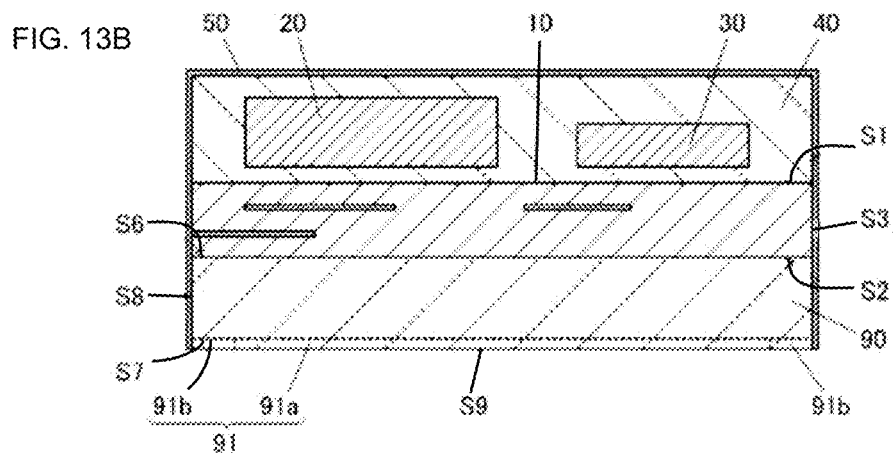
Figure 14A:
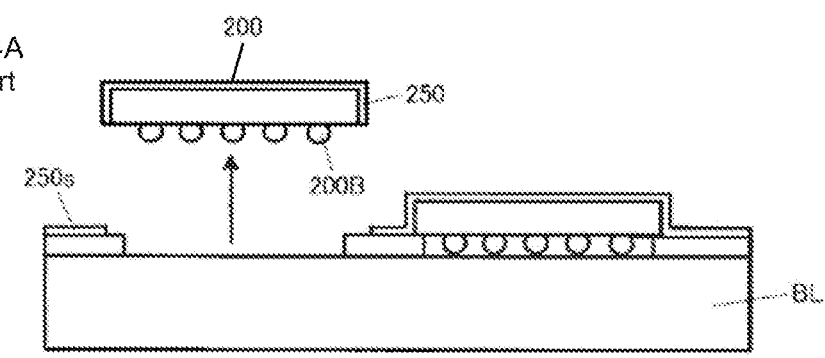
FIGS. 14A and 14B include a cross-sectional view for explaining a part of a manufacturing process of a circuit module 200 in Background Art, and a plan view (top view) of the circuit module 200.
Figure 14B:
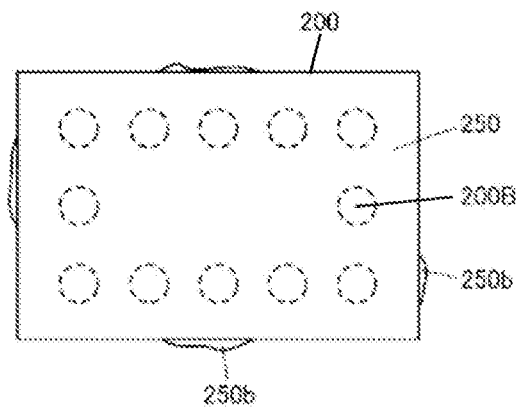

FIG. 12 is a plan view (bottom view) of the circuit module 100B. FIG. 13A is a cross-sectional view of the circuit module 100B, when viewed in an arrow direction, taken by cutting along a plane including an X5-X5 line illustrated in FIG. 12. FIG. 13B is a cross-sectional view of the circuit module 100B, when viewed in an arrow direction, taken by cutting along a plane including an X6-X6 line. Note that although FIG. 12 is not a cross-sectional view, in order to facilitate understanding of constituent members, some constituent members are shaded.

The circuit module 100B includes the second electronic component 70, the plurality of via conductors 80, and the second resin layer 90, in the same manner as the circuit module 100A. Since the second electronic component 70, the plurality of via conductors 80, and the second resin layer 90 are the same as those of the circuit module 100A, including a connection relationship and a sealing relationship, the description thereof will be omitted. The conductor film 50 is, in the same manner as the circuit module 100A, provided on the outer surface of the first resin layer 40, on the side surface S3, on the surface S8, and on the vicinity of the outer perimeter of the surface S7.

On the other hand, the circuit module 100B does not include the resin film 60 (first resin film 60a and second resin film 60b). Alternatively, the second resin layer 90 includes a projecting portion 91 on the surface S7 which is a virtual surface. In other words, the projecting portion 91 is a part of the second resin layer 90. The projecting portion 91 includes a first projecting portion 91a and a plurality of second projecting portions 91b. The first projecting portion 91a has a surface S9 facing the surface S7. The second projecting portion 91b has one end flush with the surface S8 and the other end extending so as to separate from the surface S8.

That is, the second resin layer 90 of the circuit module 100B can be regarded as a member in which the resin film 60 and the second resin layer 90 in the circuit module 100A are integrally formed of the same material.

The plurality of outer electrodes B1 is arranged, in an inner side portion of the outer perimeter of the surface S9 of the first projecting portion 91a, so as to be exposed from the surface S9, in a plan view in the normal direction of the surface S7 of the second resin layer 90 (in a plan view viewed from the lower surface side of the circuit module 100B) (see FIG. 12). Furthermore, the plurality of second projecting portions 91b is arranged such that a second gap C2 is present between two adjacent second projecting portions 91b (see FIG. 12).

The second gaps C2 need not have the same form, and need not have the same width, between all the two adjacent second projecting portions 91b, in the same manner as the circuit module 100A. For example, in the circuit module 100B illustrated in FIG. 12, in the plurality of second projecting portions 91b in contact with the four sides of the rectangular first projecting portion 91a, all the second gaps C2 have the same width. On the other hand, the second gap C2 between the two second projecting portions 91b located at the corner portion of the first projecting portion 91a is different in shape from the second gaps C2 on the above-described respective sides, and is also different in width therefrom.

In the circuit module 100B as well, in the manufacturing process, the metal fine particles generated by the sputtering for forming the conductor film 50 also adhere to the outer surface of the adhesive layer AL, and become the excess conductor film 50s connected to the conductor film 50 (see FIG. 3A). Note that in the same manner as the manufacturing process of the circuit module 100A, a space in which the conductor film 50 is not formed remains in the second gap C2. As a result, in the conductor film 50, the window portion W which is arranged like perforations and which is not connected to the excess conductor film 50s is generated.

Then, when the circuit module 100B to which the conductor film 50 is applied is peeled off from the base BL, the window portion W serves as a starting point, and a portion where the conductor film 50 and the excess conductor film 50s are in contact is broken. As a result, the circuit module 100B in which the adhesion of the excess conductor film 50s (so-called burr) is suppressed is obtained. That is, in the circuit module 100B as described above, the occurrence of failure in the electronic apparatus due to the burrs is suppressed.

It should be understood that the embodiments disclosed herein are illustrative in all aspects and not restrictive. The scope of the present disclosure is indicated by the scope of the claims, and is intended to include all modifications within the meaning and range equivalent to the scope of the claims.

1 INSULATOR LAYER
2 INNER CONDUCTOR
2a PATTERN CONDUCTOR
2b VIA CONDUCTOR
3, 4, 5 LAND
10 SUBSTRATE
20, 30 FIRST ELECTRONIC COMPONENT
40 FIRST RESIN LAYER
50 CONDUCTOR FILM
60 RESIN FILM
60a FIRST RESIN FILM
60b SECOND RESIN FILM
100 CIRCUIT MODULE
B1 OUTER ELECTRODE
B2, B3 CONNECTION MEMBER
C1 FIRST GAP
S1 ONE MAIN SURFACE
S2 THE OTHER MAIN SURFACE
S3 SIDE SURFACE
S4, S5 SURFACE

The invention claimed is:

1. A circuit module comprising:
a substrate including a plurality of inner conductors;
a first electronic component arranged on one main surface of the substrate;
a first resin layer provided on the one main surface and configured to seal the first electronic component;
a plurality of outer electrodes provided on another main surface of the substrate and including a ground electrode;
a conductor film provided at least on an outer surface of the first resin layer and a side surface of the substrate and connected to the ground electrode with at least one of the plurality of inner conductors interposed between the conductor film and the ground electrode; and
a resin film,
wherein the resin film includes a first resin film provided on the other main surface and a plurality of second resin films provided so as to extend from the first resin film in an outer side portion relative to the first resin film in a plane direction of the substrate,
the plurality of outer electrodes is arranged so as to be exposed from the first resin film, and
arbitrary adjacent two of the second resin films among the plurality of second resin films are arranged so as to be spaced from each other.

2. The circuit module according to claim 1,
wherein the resin film further includes a third resin film, and
the arbitrary adjacent two of the second resin films are connected to each other by the third resin film.

3. A circuit module comprising:
a substrate including a plurality of inner conductors;
a first electronic component arranged on one main surface of the substrate;
a second electronic component arranged on another main surface of the substrate;
a plurality of via conductors connected to the other main surface of the substrate;
a first resin layer provided on the one main surface and configured to seal the first electronic component;

a second resin layer provided on the other main surface and configured to seal the second electronic component and the plurality of via conductors;

a plurality of outer electrodes provided on the second resin layer and including a ground electrode;

a conductor film provided at least on an outer surface of the first resin layer, a side surface, and a side surface of the second resin layer and connected to the ground electrode with at least one of the plurality of inner conductors and at least one of the plurality of via conductors interposed between the conductor film and the ground electrode; and a resin film, wherein the resin film includes a first resin film provided on the second resin layer and a plurality of second resin films provided so as to extend from the first resin film in an outer side portion relative to the first resin film in a plane direction of the substrate, the plurality of outer electrodes is arranged so as to be exposed from the first resin film, and arbitrary adjacent two of the second resin films among the plurality of second resin films are arranged so as to be spaced from each other.

4. A circuit module comprising:

a substrate including a plurality of inner conductors;

a first electronic component arranged on one main surface of the substrate;

a second electronic component arranged on another main surface of the substrate;

a plurality of via conductors connected to the other main surface of the substrate;

a first resin layer provided on the one main surface and configured to seal the first electronic component;

a second resin layer provided on the other main surface and configured to seal the second electronic component and the plurality of via conductors;

a plurality of outer electrodes provided in the second resin layer and including a ground electrode; and a conductor film provided at least on an outer surface of the first resin layer, a side surface, and a side surface of the second resin layer and connected to the ground electrode with at least one of the plurality of inner conductors and at least one of the plurality of via conductors interposed between the conductor film and the ground electrode, wherein the plurality of outer electrodes is arranged so as to be exposed from the second resin layer, and on a surface of the second resin layer, a first projecting portion and a plurality of second projecting portions provided so as to extend from the first projecting portion in an outer side portion in the plane direction of the substrate are formed, and arbitrary adjacent two of the second projecting portions among the plurality of second projecting portions are arranged so as to be spaced from each other.

* * * * *